(12) United States Patent
Morohashi et al.

(10) Patent No.: US 6,388,529 B2
(45) Date of Patent: May 14, 2002

(54) GROUNDED EMITTER AMPLIFIER AND A RADIO COMMUNICATION DEVICE USING THE SAME

(75) Inventors: Hideo Morohashi; Shinichi Tanabe, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/758,424

(22) Filed: Jan. 12, 2001

(30) Foreign Application Priority Data

Jan. 13, 2000 (JP) ........................................ 2000-004157

(51) Int. Cl.[7] ............................... H03F 3/04; H03G 3/10
(52) U.S. Cl. ...................... 330/296; 330/285; 455/232.1
(58) Field of Search ................................ 330/296, 285; 455/232.1

(56) References Cited

U.S. PATENT DOCUMENTS

| 4,334,198 | A | 6/1982 | Malchow | 330/296 |
|---|---|---|---|---|
| 5,357,089 | A | 10/1994 | Prentice | 330/298 |
| 5,654,672 | A | 8/1997 | Bailey et al. | 330/289 |
| 6,018,270 | A | 1/2000 | Stuebing et al. | 330/278 |
| 6,239,659 | B1 | 5/2001 | Grässle | 330/282 |
| 6,265,942 | B1 | 7/2001 | Grässle | 330/282 |
| 2000/0013811 | | 8/2001 | Morohashi et al. | 330/296 |

*Primary Examiner*—Michael B Shingleton
(74) *Attorney, Agent, or Firm*—Ronald P. Kananen, Esq.; Rader, Fishman & Grauer, PLLC

(57) ABSTRACT

A grounded emitter amplifier and a radio communication device using the same in which a bias voltage is generated in order to adjust an emitter current of a transistor in a grounded emitter amplification circuit so that the emitter current does not receive an influence of variations in several parameters of the transistor such as a current amplification factor hfe.

3 Claims, 4 Drawing Sheets

GROUNDED EMITTER AMPLIFIER AND A RADIO COMMUNICATION DEVICE USING THE SAME

BACKGROUND OF THE INVENTION

1. Field of the Invention

The present invention relates to a grounded emitter amplifier and a radio communication device using the same. Specifically, the present invention relates to a grounded emitter amplifier suitable for application in an integrated circuit and a radio communication device using such grounded emitter amplifier.

2. Description of the Related Art

A typical circuit configuration for a conventional grounded emitter amplifier is exemplified in FIG. 4, in which an emitter of a transistor 101 is connected to the ground through an emitter resistor 102, and a collector of the transistor 101 is connected to an electric power source supplying a voltage VCC through a load resistor 103. In addition, a base of the transistor 101 is biased by a constant bias voltage Vbias supplied by a direct-current voltage source 104 through a base resistor 105. Then, by applying an input signal Vi to a terminal Vin connected to the base of the transistor 101 through a capacitor 106, an output signal Vo is led out from a terminal Vout connected to a collector of the same transistor 101.

As the constant bias voltage Vbias being applied to the base of the transistor 101, the grounded emitter amplifier like described above has the problem of changing an emitter current Ie of the transistor 101 when variations in several parameters of the transistor such as a current amplification factor hfe occur. This problem is explained through the mathematical expressions shown below:

when a base current of the transistor 101 is Ib and a collector current of the same transistor 101 is Ic, an emitter current Ie is obtained from $$Ie=Ib+Ic \quad (101);$$

in addition, the collector current Ic is obtained from $$Ic=hfe \times Ib \quad (102);$$

then yields, from equations (101) and (102), $$Ie=(1+hfe) \times Ib \quad (103).$$

Therefore, the emitter current Ie of the transistor 101 is changed according to the current amplification factor hfe of the same transistor 101. When the emitter current Ie is changed, variations in power consumption and variations in a resistance value of the emitter resistor 102 of the transistor 101 itself occur, thus causing variation in gain.

SUMMARY OF THE INVENTION

It is an object of the present invention to provide a grounded emitter amplifier and a radio communication device using the same. The amplifier of the present invention has a construction in which an emitter current of a transistor is not influenced by variations in several parameters of the transistor such as a current amplification factor hfe.

The amplifier according to the present invention has a configuration comprising an amplification circuit having a grounded emitter first transistor and a base first resistor connected between a base electrode of the first transistor and a bias terminal; a grounded emitter second transistor having a collector electrode connected to the bias terminal; an operational amplifier including an inverted input connected to an emitter potential of the second transistor; a non-inverted input connected to a predetermined direct current voltage; and an output terminal connected to the bias terminal mentioned above; and a bias voltage generation circuit having a base second resistor connected between the output terminal of the operational amplifier above and a base electrode of the second transistor.

The amplification device of the present invention as described above satisfies the condition in which, when a resistance value of the base resistor of the first transistor is Rb1 and, likewise, a resistance value of the base resistor of the second transistor is Rb2, and an emitter area of the same first transistor is Q1 and, likewise, an emitter area of the same second transistor is Q2, then $$Rb1=Rb2/n$$

and $$Q1=n \times Q2,$$

where n is a positive number.

The factor n such as described in the equations above can be realized easily by applying a monolithic IC technology.

In addition, the amplification device of the present invention realized according to the construction mentioned above can be used to constitute a means of amplification of an intermediate-frequency (IF) signal for a radio communication device.

According to the amplification device and the radio communication device of the construction mentioned above, the grounded emitter amplification circuit and the bias voltage generation circuit satisfying the conditions described above allow the bias voltage generation circuit to generate and supply to a grounded emitter amplification circuit a bias voltage that adjusts the emitter current of a transistor in the grounded emitter amplification circuit so that such emitter current does not receive an influence of variations in several parameters of the transistor such as a current amplification factor hfe.

In other words, if a grounded emitter amplifier and a radio communication device using the same are constructed according to the present invention, then the grounded emitter amplifier and the radio communication device using the same have the characteristics of generating a bias voltage that adjusts the emitter current of the grounded emitter amplification circuit without receiving an influence of variations in several parameters of a transistor of the grounded emitter amplification circuit such as an electric current amplification factor hfe. By supplying such a bias voltage to the grounded emitter amplification circuit, it is possible to obtain an emitter current that does not receive an influence of variations in several parameters of the transistor such as the electric current amplification factor hfe.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which.

DESCRIPTION OF THE PREFERRED EMBODIMENTS

A detailed description of a preferred embodiment of the present invention is made with reference to the drawings mentioned above, as follows.

Figure 1:
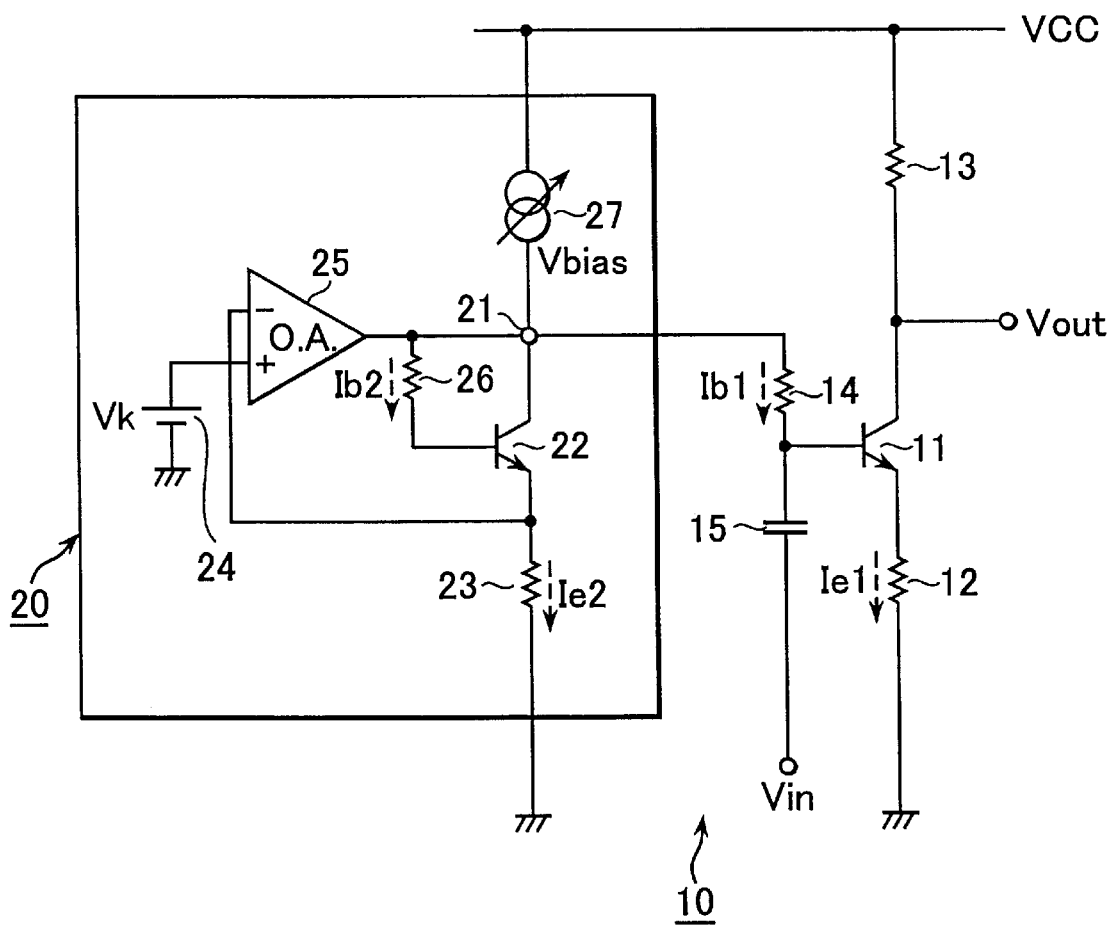
FIG. 1 is a circuit diagram showing a configuration of an amplification device according to a preferred embodiment of the present invention.

According to FIG. 1, an emitter electrode of a bipolar transistor 11 is connected to the ground through an emitter resistor 12 and a collector electrode of the transistor 11 is connected to an electric power source supplying a voltage VCC through a load resistor 13. In addition, a base electrode of the same transistor 11 is connected to one electrode of a base resistor 14, therefore constituting a grounded emitter amplification circuit 10.

According to the grounded emitter amplification circuit 10 above, a bias voltage Vbias is supplied to the base electrode of the transistor 11 by a bias voltage generation circuit 20 through the base resistor 14. In addition, an input signal Vi applied to an input terminal Vin is supplied to the base electrode of the transistor 11 through a capacitor 15. Thus, an output signal Vo is led out through the collector electrode of the transistor 11 from a terminal Vout.

Yet, the bias voltage generation circuit 20 comprises a bipolar transistor 22 having its collector electrode connected to a bias terminal 21; an emitter resistor 23 connected between the transistor 22 and the ground; an operational amplifier 25 having an inverted input (−), a non-inverted input (+) and an output, wherein the operational amplifier 25 has the inverted input (−) connected to a potential of an emitter electrode of the transistor 22, the non-inverted input (+)connected to a direct current voltage Vk that is supplied by a direct current power source 24, and the output connected to the bias terminal 21 mentioned above; and a base resistor 26 connected between the output terminal of the operational amplifier 25 and a base electrode of transistor 22.

In addition, a current source 27 that changes the value of a current according to a load is connected between the bias terminal 21 and the electric power source supplying the voltage VCC.

According to the grounded emitter amplifier described above, when resistance values of the emitter resistors 12 and 23 are respectively Re1 and Re2, and resistance values of the base resistors 14 and 26 are respectively Rb1 and Rb2, then the resistance value Re1 of the emitter resistor 12 is set so as to satisfy the condition $$Re1 = Re2/n \quad (1)$$

and, likewise, the resistance value Rb1 of the base resistor 14 is set so as to satisfy the condition $$Rb1 = Rb2/n \quad (2)$$

where n is a positive number.

Still, when an emitter area of the transistor 11 is Q1 and an emitter area of the transistor 22 is Q2, the emitter area of the transistor 11 is set so as to satisfy the condition $$Q1 = n \times Q2 \quad (3)$$

where n is a positive number.

The factor n such as described in the equations above can be realized easily by applying a monolithic IC technology.

Furthermore, for the bias voltage generation circuit 20 explained above, when Ie2 is an emitter current, Ib2 is a base current and Vbe2 is a base-emitter voltage of the transistor 22, then a bias voltage Vbias is obtained from $$Vbias = Ie2 \times Re2 + Vbe2 + Ib2 \times Rb2.$$

From the fact that $Ib2 = Ie2/(1+hfe)$ as shown by the equation 103 described above, then yields $$Vbias = Ie2 \times [Re2 + Rb2/(1+hfe)] + Vbe2.$$

On the other hand, for the grounded emitter amplification circuit 10, when Ie1 is an emitter current, Ib1 is a base current and Vbe1 is a base-emitter voltage of the transistor 11, then yields, from the equations (1), (2) and (3) above, $$Ie2 \times [Re2 + Rb2/(1+hfe)] + Vbe2 = Ie1 \times [Re1 + Rb1/(1hfe)] + Vbe1 = Ie1n \times [Re2/(1+hfe)] + Vbe1 \quad (4)$$

where n is a positive number.

From the equation (4) above, an emitter current Ie1 of the transistor 11 is obtained from $$Ie1 = n \times Ie2.$$

From the fact that $Ie2 = (Vk/Re2)$, then yields $$Ie1 = n \times (Vk/Re2) \quad (5).$$

As it is clearly shown by the equation (5) above, the emitter current Ie1 that flows through the grounded emitter amplification circuit 10 does not receive an influence of a variation in a current amplification factor hfe of the transistor 11.

As explained above, the grounded emitter amplifier of the present invention is constructed in order to have a grounded emitter amplification circuit 10 and the bias voltage generation circuit 20 that satisfies the conditions set forth by the equations (1) to (3) above. In addition, by supplying the bias voltage Vbias generated by the bias voltage generation circuit 20 to the grounded emitter amplification circuit 10, it becomes possible to obtain the emitter current Ie1 flowing through the grounded emitter amplification circuit 10 without receiving the influence of variations in several parameters of the transistor 11 such as the current amplification factor hfe.

Furthermore, the preferred embodiment of the present invention is not limited to the example described above, which is applicable to a grounded emitter amplification circuit 10 having the emitter resistor 12, but also applies in the same way to a grounded emitter amplification circuit 10 that does not have the emitter resistor 12. In such case, it is possible to omit the emitter resistor 23 of the bias voltage generation circuit 20.

The grounded emitter amplifier of the present invention herein described is applicable, for example, to constitute a means of intermediate-frequency (IF) amplification for radio communication devices such as a mobile communication system or the like.

However, for a mobile communication system such as a mobile telephone system or the like, as for increasing a line capacity of a base station, it is desirable to have control over an output power of each a mobile terminal in order to have a same signal strength at a base station. Specifically, such an output power control of the mobile terminal is an essential requirement for a spectrum scattering system called CDMA (Code Division Multiple Access), in which a plurality of mobile terminals are allocated to a same frequency band and a signal is recovered by means of a scattering code.

There are two types of systems for an output power control of a mobile terminal. One is a system in which a required output power of the mobile terminal is determined in accordance to a signal strength of a signal from a base station received by the mobile terminal. Such system, called an open loop control, is based on a hypothesis that there is a strong correlation between a propagation of a signal from a base station to a mobile terminal and vice-versa. Another system is one in which information about an actual strength of a received signal at the base station is transmitted to the mobile terminal. Such a system is called a closed loop control.

In order to perform an output power control, a gain control circuit is required and such gain control circuit requires four conditions. Namely, it is required, firstly to have a wide gain control range, secondly to be of a wide dynamic range, thirdly to have good linearity, absolute gain accuracy and temperature characteristics, and fourthly to be of a broad frequency bandwidth.

A wide gain control range is, for example, to have a 90 dB level at a reception side and an 80 dB level at a transmission side. As for the dynamic range, it is necessary to consider a condition in which a desired signal comes in weak and under a strong interference signal, so a tolerance to a strong input and a low noise characteristic are both required.

Concerning the linearity, the absolute gain accuracy and the temperature characteristics, it is necessary to have such characteristics matching each other between gain control circuits at both the reception and the transmission sides in order to improve an accuracy of the open loop control mentioned above.

Furthermore, although differing from system to system, a bandwidth operation is more easily done at an intermediate-frequency (IF) level. For this sake, a typical intermediate-frequency (IF) is often set at around 100 MHz.

Figure 2:
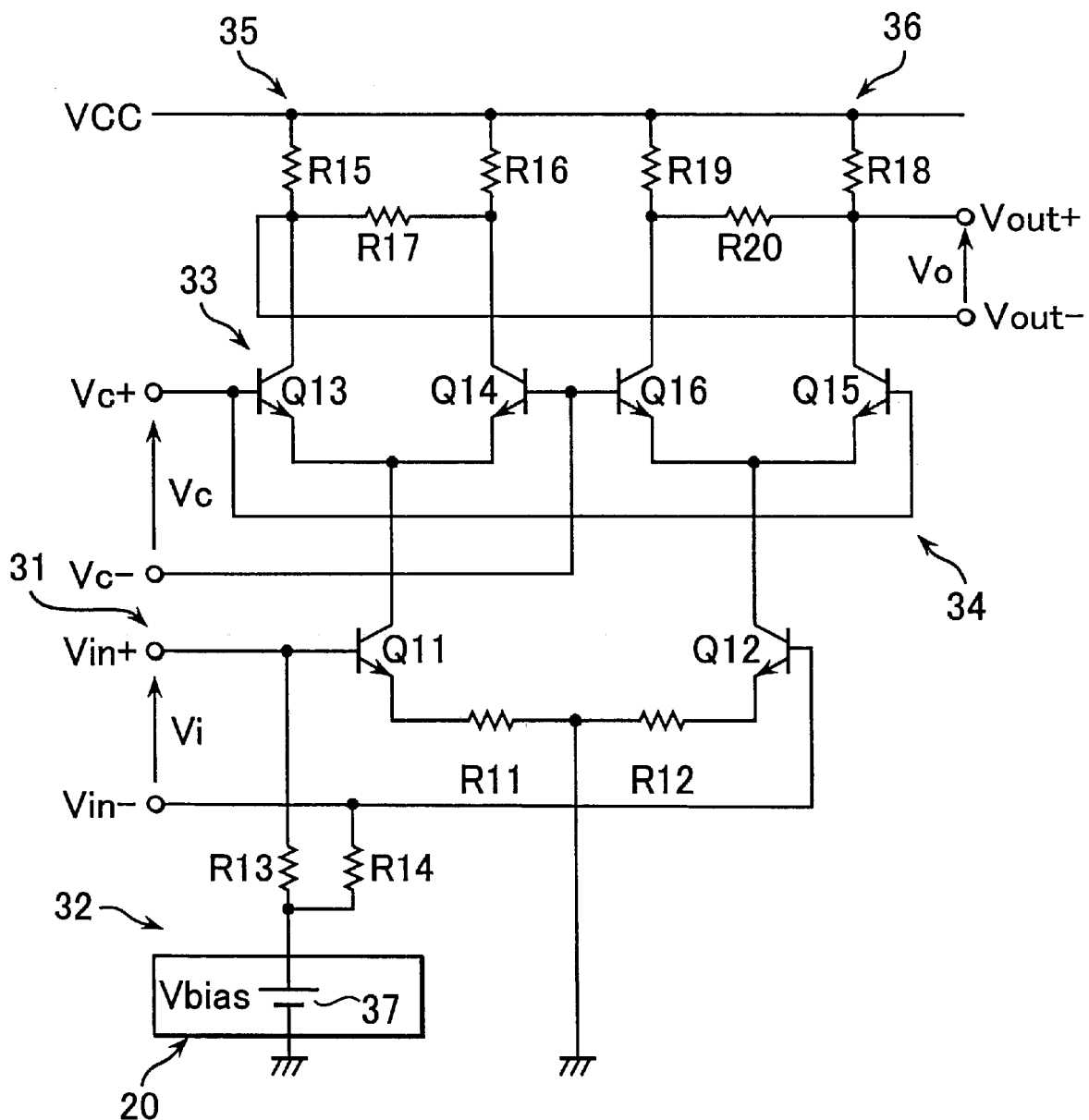
FIG. 2 is a circuit diagram showing a circuit configuration of a variable gain circuit comprising a grounded emitter amplification circuit according to a preferred embodiment of the present invention.

FIG. 2 is a circuit diagram showing a preferred circuit configuration for a variable gain circuit that constitutes a gain control circuit according to the present invention. The variable gain circuit according to the present invention has a differential amplification circuit 31, a bias circuit 32, two current dividing circuits 33 and 34, and two resistive mesh-connected circuits 35 and 36.

The differential amplification circuit 31 comprises differential pair transistors Q11 and Q12, both of npn type, having each emitter electrode connected to the ground giving a potential level of reference, through their respective emitter resistors R11 and R12. An input voltage Vi is applied between terminals Vin+ and Vin−, connected respectively to base electrodes of the differential pair transistors Q11 and Q12.

The bias circuit 32 comprises bias resistors R13 and R14 having each one electrode connected to the respective base electrodes of the differential pair transistors Q11 and Q12 and a bias electric power source 37 that supplies a bias voltage Vbias to each base electrode of the pair of transistors Q11 and Q12 through respective bias resistors R13 and R14. Yet, as shown by surrounding with a rectangle in FIG. 2, the bias electric power source 37 corresponds to the bias voltage generation circuit 20 described in FIG. 1.

The current dividing circuit 33 comprises differential pair transistors Q13 and Q14, both of npn type, having their respective emitter electrodes connected in common to a collector electrode of the transistor Q11. Likewise, the other current dividing circuit 34 comprises differential pair transistors Q15 and Q16, also of npn type, having their respective emitter electrodes connected in common to a collector electrode of the transistor Q12.

The current dividing circuits 33 and 34 have each base electrode of transistors Q13 and Q15 connected in common and, likewise, each base electrode of transistors Q14 and Q16 connected in common. Then, a control voltage Vc is applied between input terminals Vc+ and Vc− connected respectively to the above-mentioned common connections of base electrodes of the transistors Q13 and Q15, Q14 and Q16. Finally, an output voltage Vo is led out between output terminals Vout+ and Vout− connected respectively to each collector electrode of the transistors Q13 and Q15.

One resistive mesh-connected circuit 35 comprises resistors R15 and R16 connected between an electric power source supplying a voltage VCC and respective collector electrodes of the differential pair transistors Q13 and Q14, and a resistor R17 connected between the respective collector electrodes of the same differential pair transistors Q13 and Q14. Likewise, another resistive mesh-connected circuit 36 comprises resistors R18 and R19 connected between the electric power source supplying the voltage VCC and respective collector electrodes of the differential pair transistors Q15 and Q16, and a resistor R20 connected between the collector electrodes of the differential pair transistors Q15 and Q16.

The grounded emitter amplifier according to the present invention is used in the variable gain circuit of the construction explained above to constitute the differential amplification circuit 31. In fact, when comparing the circuits of FIG. 2 and FIG. 1, the differential pair transistors Q11 and Q12 corresponds to the transistor 11, the resistors R11 and R12 correspond to the emitter resistor 12 and the base resistors R13 and R14 correspond to the base resistor 14. In addition, the bias voltage generation circuit 20 is used as the bias electric power source 37.

Figure 3:
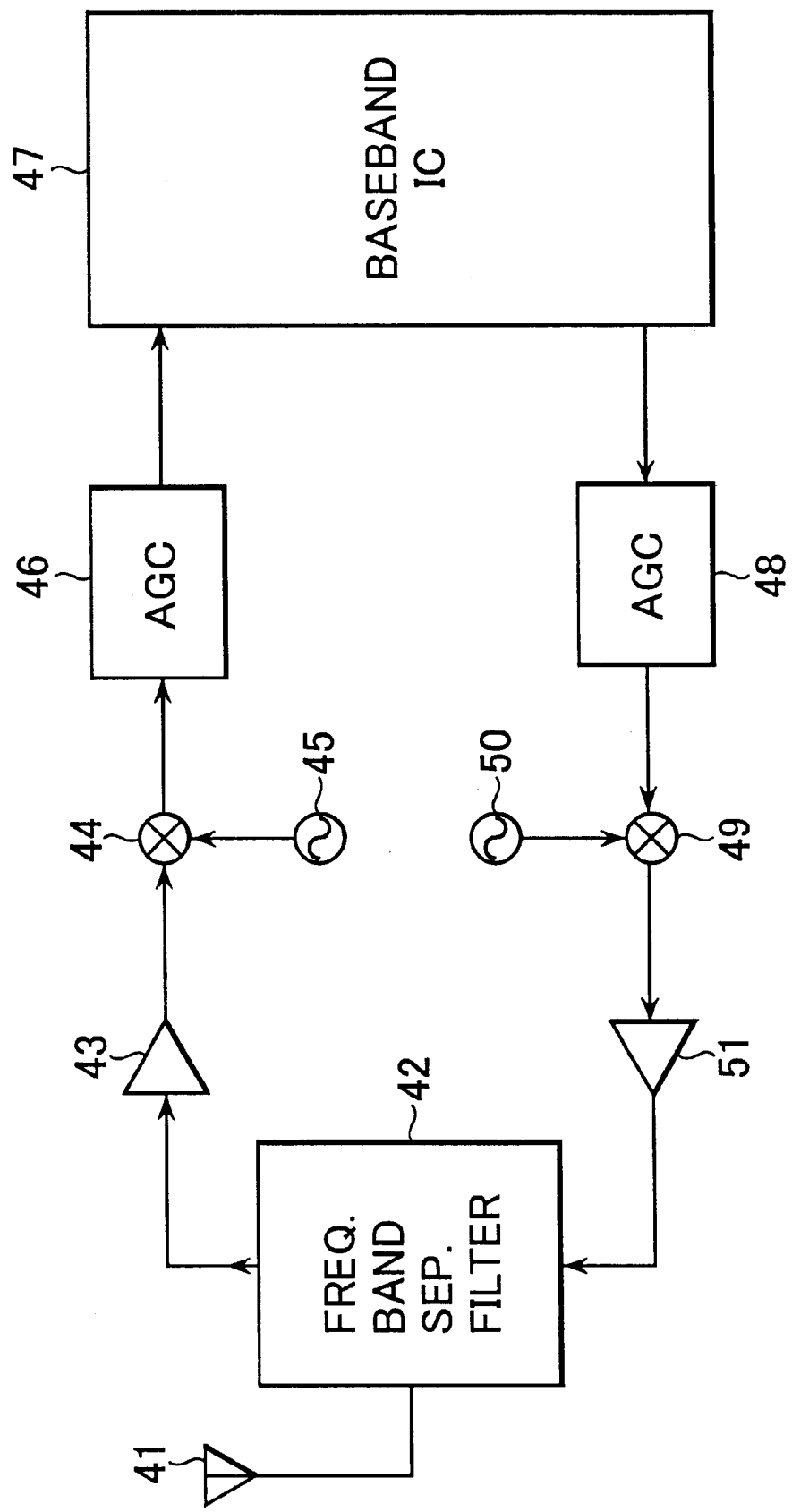
FIG. 3 is a block diagram showing a characteristic diagram of a configuration for a RF front-end part of a mobile phone device using a CDMA system according to a preferred embodiment of the present invention.
Figure 4:
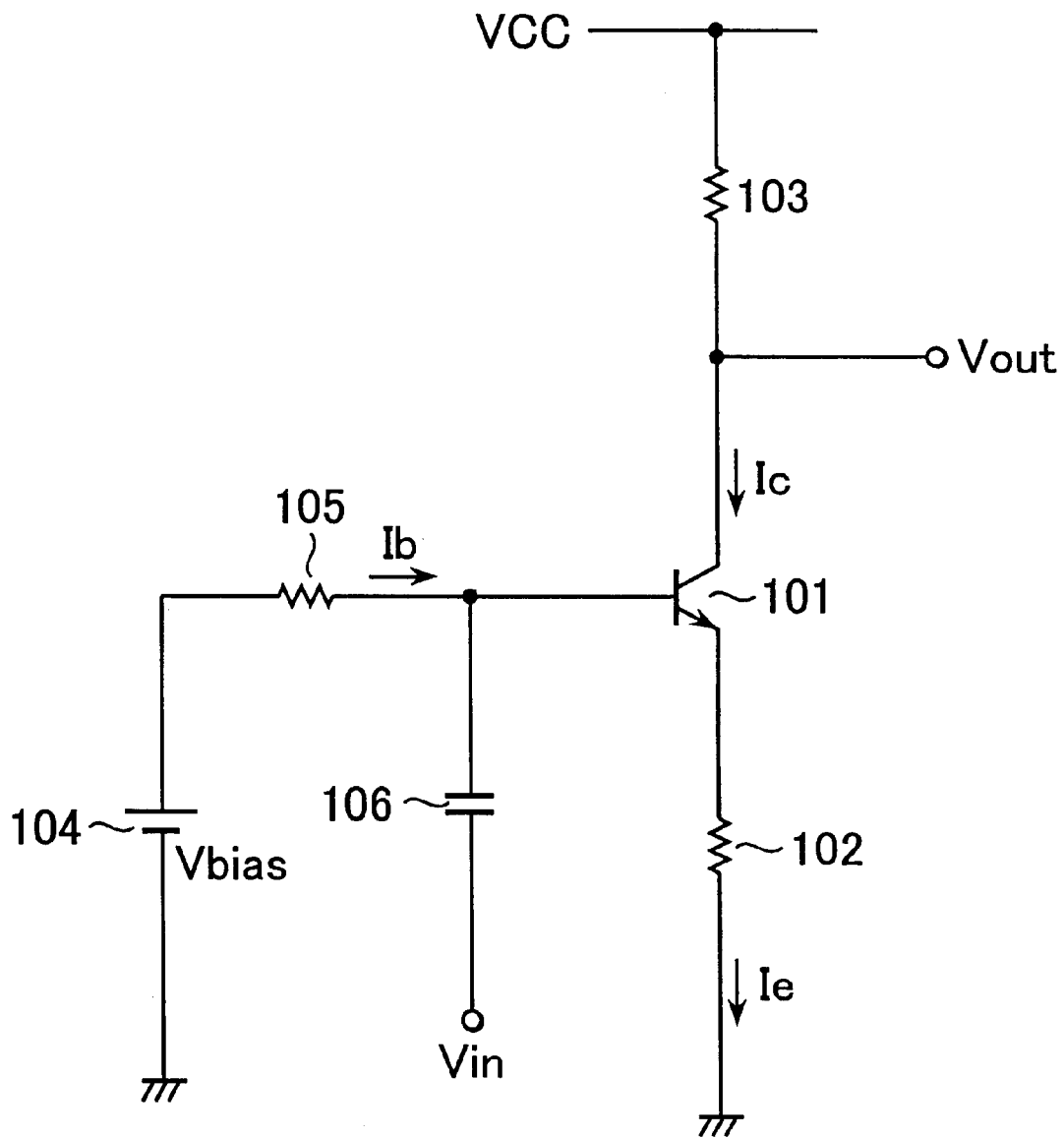
FIG. 4 is a circuit diagram showing a circuit configuration of a conventional grounded emitter amplification circuit.

Finally, the variable gain circuit explained above is used, for example, to constitute a gain control circuit of a RF front-end section (AGC amplifier) of a portable telephone device using the CDMA system explained before. FIG. 3 is a block diagram showing a preferred embodiment of a RF front-end section of a portable telephone device using the CDMA system.

According to FIG. 3, a reception signal captured by an antenna 41 is supplied to a mixer 44 through a low noise amplifier 43, after passing through a frequency band separation filter (FREQ. BAND SEP. FILTER) 42 that is used in common for both transmission and reception. At the mixer 44, the reception signal is mixed with a local oscillation frequency signal generated by a local oscillator 45, converted to an intermediate-frequency signal (IF) and finally supplied to a base band IC (BASEBAND IC) 47 of a later stage after the signal level is stabilized at an AGC amplifier 46. The base band IC (BASEBAND IC) 47 performs the conversion of the intermediate-frequency signal (IF) to an analog, audio-frequency signal to be supplied, for instance, to a speaker.

On the other hand, an analog, audio-frequency signal coming, for example, from a microphone is converted to an IF signal at the base band IC (BASEBAND IC) 47 and, at a transmission side, the IF signal supplied from the base band IC (BASEBAND IC) 47 of a preceding stage is then supplied to a mixer 49 after been amplified at an AGC amplifier 48. Then, the signal is mixed with a local oscillation signal generated by a local oscillator 50 and converted to a RF signal and then, the resulting RF signal is transmitted by the antenna 41 mentioned above after passing through a power amplifier 51 and the frequency band separation filter (FREQ. BAND SEP. FILTER) 42.

A variable gain circuit applying the grounded emitter amplifier of the present invention can be used as an AGC amplifier for a RF front-end section of a portable telephone device using the CDMA system explained above. In the example presented herein, such an AGC amplifier corresponds to the AGC amplifiers 46 and 48, that respectively amplify the IF signal of the reception side and the IF signal of the transmission side.

As explained above, the grounded emitter amplifier of the present invention can be applied to constitute a variable gain circuit that can be used as the AGC amplifier 46 as well as the AGC amplifier 48 of respectively the reception and the transmission sections of the portable telephone device using the CDMA system. As a result, the grounded emitter amplifier of the present invention can contribute to a stabilization of an electric power consumption of the portable telephone device as a whole, since an emitter current of such grounded emitter amplifier is nearly constant and, consequently, a variation in electric power consumption becomes small.

Finally, although the present explanation is done by reference to an application for the portable telephone device using the CDMA system, the present invention is not limited to the application explained herein. Accordingly, the present invention can be applied to radio communication devices in general.

What is claimed is:

1. An amplification device comprising:

an amplification circuit having a grounded emitter first transistor and a first base resistor connected between the base electrode of said first transistor and a bias terminal; and a bias voltage generation circuit including:
   a grounded emitter second transistor having a collector electrode connected to said bias terminal;
   an operational amplifier equipped with:
      an inverted input electrode connected to a potential of an emitter electrode of said second transistor;
      a non-inverted input connected to a predetermined direct-current voltage; and
      an output terminal connected to said bias terminal; and
   a second base resistor connected between the output terminal of said operational amplifier and a base electrode of said second transistor; wherein when a resistance value of said first base resistor is Rb1 and a resistance value of said second base resistor is Rb2, an emitter area of said first transistor is Q1 and an emitter area of said second transistor is Q2, then, the following relations are satisfied:

$$Rb1=Rb2/n$$

and $$Q1=n \times Q2$$

where n is a positive number.

2. An amplification device according to claim 1, wherein said first and second transistors have their respective emitter resistors that satisfies a following relation:
if resistance values of said emitter resistors are respectively Re1 and Re2, then $$Re1=Re2/n$$

where n is a positive number.

3. A radio communication device for amplifying an intermediate-frequency signal, in which said radio communication device comprises:

an antenna;

an amplification device for amplifying a signal received by said antenna;

a mixer circuit for combining the signal amplified by said amplification device with a local oscillation signal; and a gain amplification circuit for stabilizing an output signal coming from said mixer circuit to a constant level, wherein said gain amplification circuit includes:
an amplification circuit having a grounded emitter first transistor and a first base resistor connected between the base electrode of said first transistor and a bias terminal; and
a bias voltage generation circuit including:
   a grounded emitter second transistor having a collector electrode connected to said bias terminal;
   an operational amplifier equipped with:
      an inverted input electrode connected to a potential of an emitter electrode of said second transistor;
      a non-inverted input connected to a predetermined direct-current voltage; and
      an output terminal connected to said bias terminal; and
   a second base resistor connected between the output terminal of said operational amplifier and a base electrode of said second transistor; wherein said gain amplification circuit satisfies the following relations:

when a resistance value of said first base resistor is Rb1 and a resistance value of said second base resistor is Rb2, an emitter surface area of said first transistor is Q1 and an emitter surface area of said second transistor is Q2, then, $$Rb1=Rb2/n$$

and $$Q1=n \times Q2$$

where n is a positive number.

\* \* \* \* \*